United States Patent [19]
Ono et al.

[11] Patent Number: 5,270,488
[45] Date of Patent: Dec. 14, 1993

[54] SHIELD CONSTRUCTION FOR ELECTRICAL DEVICES

[75] Inventors: Hideyo Ono; Keiji Okabe, both of Amagasaki, Japan

[73] Assignee: Mitsubishi Denki Kabushiki Kaisha, Tokyo, Japan

[21] Appl. No.: 727,489

[22] Filed: Jul. 9, 1991

[30] Foreign Application Priority Data

Jul. 27, 1990 [JP] Japan .................. 2-200997
Sep. 27, 1990 [JP] Japan .................. 2-260185

[51] Int. Cl.⁵ .............................................. H05K 9/00
[52] U.S. Cl. ................................. 174/35 R; 257/659; 361/818; 174/51
[58] Field of Search ............... 174/35 R, 35 MS, 52.1, 174/52.4, 52.2, 51; 361/272, 424; 357/84; 257/659, 660

[56] References Cited

U.S. PATENT DOCUMENTS

| | | |
|---|---|---|
| 3,614,546 | 10/1971 | Avins .................. 317/234 |
| 4,584,627 | 4/1986 | Schilling et al. .......... 361/306 |
| 4,598,307 | 7/1986 | Wakabayashi et al. ....... 357/75 |
| 5,043,533 | 8/1991 | Spielberger .............. 174/52.4 |

FOREIGN PATENT DOCUMENTS 58-10396  2/1983  Japan .
58-164292 11/1983  Japan .

*Primary Examiner*—Leo P. Picard
*Assistant Examiner*—Bot Ledynh
*Attorney, Agent, or Firm*—Rothwell, Figg, Ernst & Kurz

[57] ABSTRACT

A shield construction for electrical devices which comprises a conductive thin film mounted at least one of the surface of electrical devices. The shield construction is connected with ground leads of a electrical devices or the ground plane of the circuit board. The shield construction prevents the radiation of undesired waves from the electrical devices. As a result, the deterioration of the receiving sensitivity and noise generation becomes negligibly small even in the weak electric field area.

9 Claims, 8 Drawing Sheets

SHIELD CONSTRUCTION FOR ELECTRICAL DEVICES

BACKGROUND OF THE INVENTION

The invention relates to a shield construction for electrical devices which are placed near the antenna of mobile communication apparatus.

FIG. 8 shows a perspective view of a portable type mobile telecommunication radio apparatus. In FIG. 8, 1 is an enclosure of the radio apparatus. The enclosure and a cover of the apparatus are made of aluminum die casting. Electrical devices mounted inside of the enclosure are shielded from the radio frequency energy. 2 is a portable cover made of plastic and including a battery (not shown) inside thereof. 3 is a transmitting and receiving antenna which is mounted in the portable cover. 4 is a handset made of plastic and including a circuit board inside thereof.

FIG. 11 is a perspective viewe of the inside structure of a prior art handset 4. The handset 4 is assembled with an upper cover 41 and a lower cover 42. On the inside surfaces of the both covers, conductive coating paint is applied. Integrated circuit (IC) 44 and crystal oscillator 45 are mounted on a circuit board 40 which processes key signals and indication signals, and supplies signals to the IC 44 respectively. On the circuit board 40, there are many other circuit patterns which process on-off signal of the key board, but they are not shown in FIG. 11.

The operation of the above conventional art is explained hereinafter. The operator communicates using handset 4. In the mobile telecommunication radio apparatus, the transmitting frequency and the receiving frequency are used at the same time. If the antenna output is very large, or if the handset 4 reaches near the antenna 3, then noises are frequently emitted from the earpiece and speaker in the handset 4, or receiving sensitivity is sometimes suppressed.

Next, the phenomenon of the above noises and the receiving sensitivity suppression is explained hereinafter. IC 44 which includes a processor is mounted on the circuit board 40. The processor operates according to the clock signal generated in the crystal oscillator of IC 44. The clock signal is generally square waves and contains higher harmonic waves in it. Digital signals combined with high level signals and low level signals are also generated in the IC 44. The combined digital signals also contain many frequency component.

The conductive paint is applied on the inner sides of the upper cover 41 and lower cover 42 of the handset 4 so as to prevent interference from the radio waves. When upper cover 41 and lower cover 42 are combined, the circuit board 40 is surrounded by the conductive shield construction. Therefore the radio waves transmitted from the antenna 3 are attenuated by the shield construction before reaching the circuit board 40. When the upper cover 41 and lower cover 42 are combined however, the inside of the handset 4 can not be thoroughly shielded because of the deflection of a portion of the covers 41,42 when they are assembled together.

As stated above the coverage of the shield construction is usually incomplete. In the region of the keypad, shield construction is also incomplete. The shielding effect at the keyboard region decreases because the conductive paint is applied only in the lattice shape around the keys. Therefore if the transmitting power from the antenna 3 is very large, or if the handset 4 reaches near the antenna, the signal level of the transmitting wave which reaches the circuit board 40 becomes relatively large. If the circuit pattern distance from the key contact point to the IC 44 is long, the transmitting wave comes through the circuit board and reaches to IC 44.

As described above, the signals in the IC 44 contain clock signals and digital signals including higher harmonics. When transmitting waves above a certain level reach the IC 44, the frequency of the transmitting wave and the frequency of the clock signal or the digital signal including higher harmonics are mixed in the non-portions of the semiconductors in the IC 44. As a result, some frequency component the same as the receiving frequency are generated in the mobile telecommunication apparatus.

If the receiving signal level is equal to or smaller than the frequency components of the same frequency generated in the IC 44, receiving sensitivity deteriorates. Also, audio frequency components generated in the IC 44 are demodulated in the radio apparatus 1. As a result, receiving sensitivity is disturbed in a weak electric field area and noises are emitted out from the earpiece. Also, if the transmitting signal level becomes larger, it is rectified by the semiconductors in the IC 44. As a result, the rectified voltage changes the bias level and causes malfunction of the apparatus or breaks down the circuit elements.

SUMMARY OF THE INVENTION

It is a primary object of the present invention to provide a shield construction for electrical devices covered by insulated materials and having a plurality of leads for signal, ground and power supply, comprising:

a conductive material mounted on at least one of the surfaces of the electrical devices and connected with the ground leads of the IC or with the ground plane.

DETAILED DESCRIPTION OF THE PREFERRED EMBODIMENTS

Figure 9:
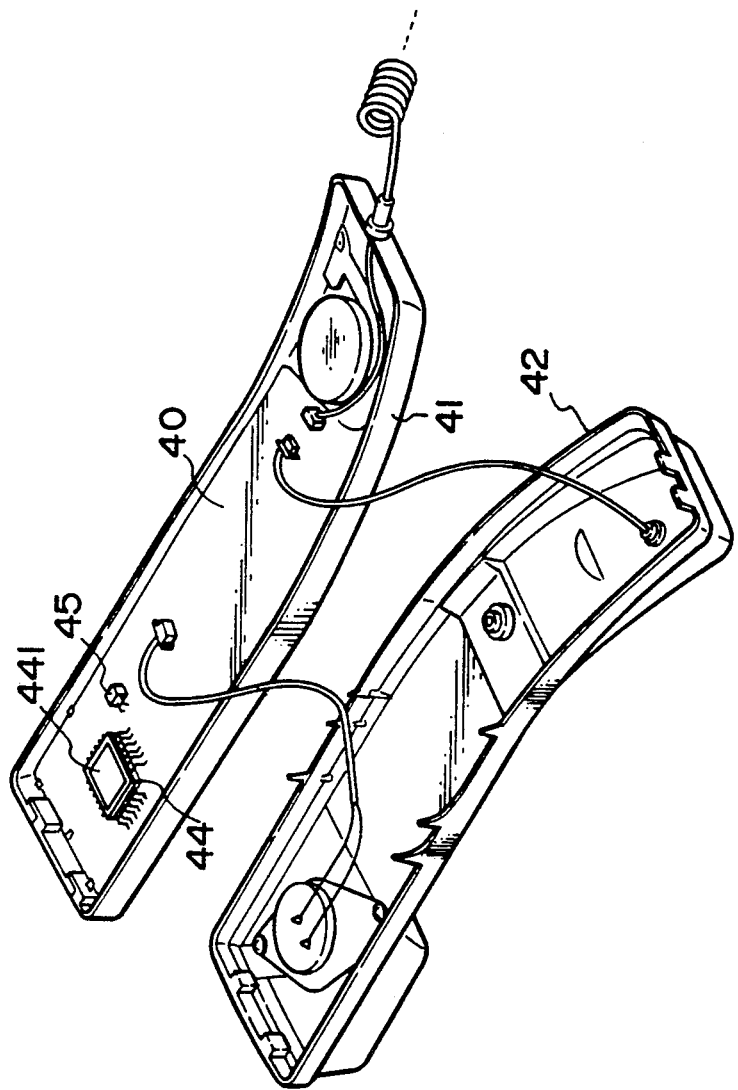
FIG. 9 is a perspective inside view of a handset of a portable type mobile radio apparatus embodying the present invention.

FIG. 9 is a perspective view of a handset showing a shield construction of the present invention. On an IC 44 on circuit board 40, a conductive thin film 441 is applied. The conductive thin film 441 is formed of good conductor such as copper film or thin copper board.

Figure 1:
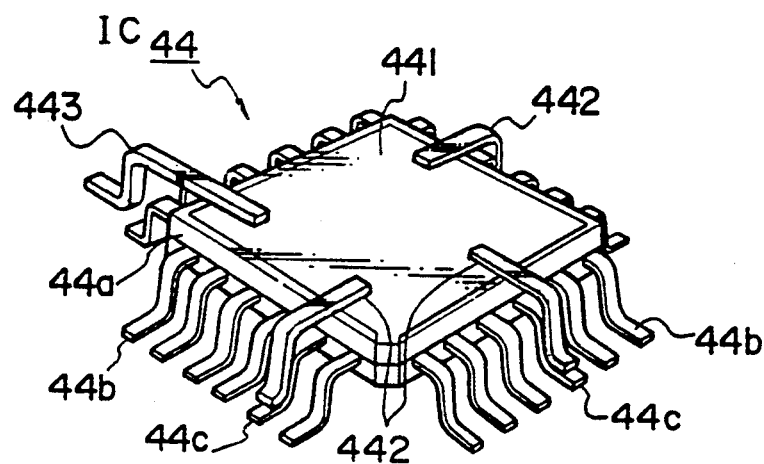
FIG. 1 is a perspective view of a first embodiment of a shield construction for an IC.

FIG. 1 shows a first embodiment of the present invention and also a perspective view of the IC 44. IC 44 has an insulated package 44a and many leads 44b at the four sides of the insulated package 44a. Some of the leads are used as ground leads 44c. The back side of the conductive thin film 441 is adhered to the surface of the package 44a a suitable adhesive. Wires 442 are conductive connection wires such as annealed copper wires. The conductive connection wires 442 connect the conductive thin film 441 with the ground lead 44c using solder, for example. Wire 443 is also formed of conductive connection wire such as annealed copper wire. Conductive connection wire 443 connects conductive thin film 441 with the ground plane on the circuit board 40 using solder, for example.

Interfering waves reaching one of the electrical device IC 44 are reflected or absorbed by the conductive thin film 441. Then the absorbed undesired waves are introduced to the ground plane or earth plane of the circuit board 40 through the conductive connection wires 442, 443. Therefore the undesired waves reaching the electrical devices in the IC 44 are considerably attenuated. As a result malfunction of the radio apparatus can be avoided. Also the incoming signal level reaching the elements in the IC 44 decreases its amount to a great extent. Therefore, the dynamic range for the undesired waves in the non-linear area of the elements become narrower. As a result, the incoming wave is not mixed with the inner signals. Also, if undesired waves are generated and radiated at the element, the radiated undesired waves are captured at the conductive thin film 441 and introduced to the ground plane. Therefore, the undesired wave is not re-radiated from the handset 4 and is not received into the radio apparatus 1 through antenna 3. As a result, the deterioration of the receiving sensitivity and noise generation is avoided even in the weak electric field area.

The conductive thin film 441 is adjacent to the inner elements of the IC 44 via insulated package 44a such as plastic materials. The surface area of the conductive thin film 441 is larger than the inner elements. Therefore it is very effective for decreasing above effects to mount the conductive thin film 441 over a surface as large as possible on the surface of the IC 44. Regarding the connection of the leads with ground in the above embodiments, the more the number of the leads increases, the more it becomes troublesome it becomes to connect the leads 44b to the ground plane.

Figure 2:
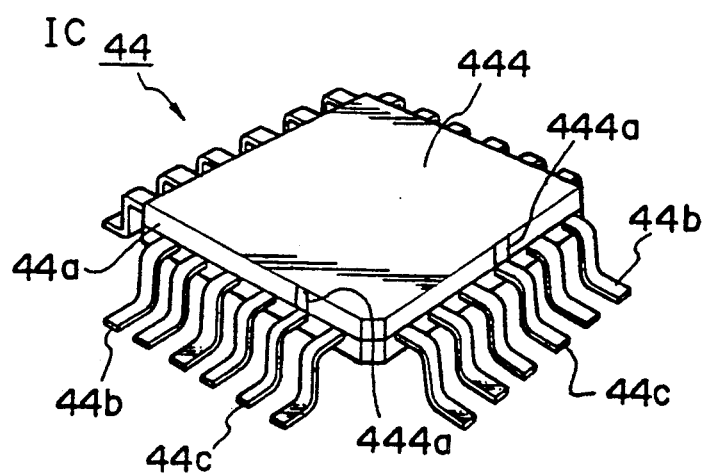
FIG. 2 is a perspective view of a second embodiment of a shield construction for an IC.

FIG. 2 shows a second embodiment of the present invention which solves the above problem. In FIG. 2, 444 is a conductive thin film which is formed by metal plating or metal coating on the surface of the package 44a of IC 44. The conductive thin film 444 is connected by its connection portions 444a with the ground leads 44c using connection method such as soldering or coating. The conductive thin film 444 is insulated by an insulation gap from the leads 44b except the ground leads 44c.

Figure 3:
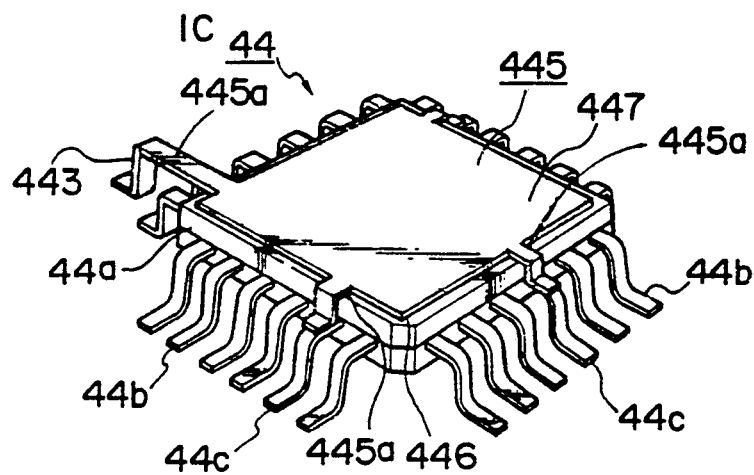
FIG. 3 is a perspective view of a third embodiment of a shield construction for an IC.

FIG. 3 shows a third embodiment of the present invention. In FIG. 3, a flexible conductive sheet 445 in the form of a flexible thin film 447 is formed on one side of the flexible plastic film 446 such as a copper foil and is adhered on the surface of the package 44a by suitable adhesives. Flexible conductive sheet 445 is connected with the ground leads 44c and the ground plane by a conductive connecting member 443 through extruded connecting members 445a using connection method such as soldering. This embodiment of the invention using flexible conductive sheet 445 can be used to mount the conductive film after electrical elements are set up in the apparatus.

Figure 4:
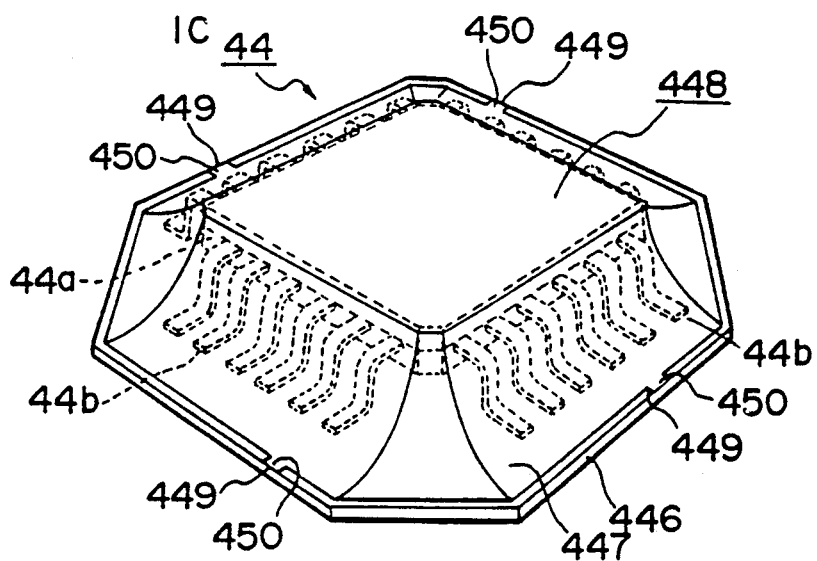
FIG. 4 is a perspective view of a fourth embodiment of a shield construction for an IC.

FIG. 4 shows a fourth embodiment of the present invention. When there is enough space around the IC 44 on the circuit board 40, the fourth embodiment can be used.

In FIG. 4, 447 is a conductive film formed on the surface of one side of a flexible plastic film 446. 449 is conductive film formed on the end surface of the flexible plastic film 446 where the ground is to be connected. 448 is a flexible conductive sheet including the conductive thin film 447 and the conductive film 449 formed on the flexible plastic film 446. The flexible conductive sheet 448 is mounted on the IC 44. The conductive film 449 is connected with circuit board 40 via throughholes 450 using a connection method such as soldering. In the above embodiment, undesired waves which come from the leads of the IC 44 are shielded.

Figure 10:
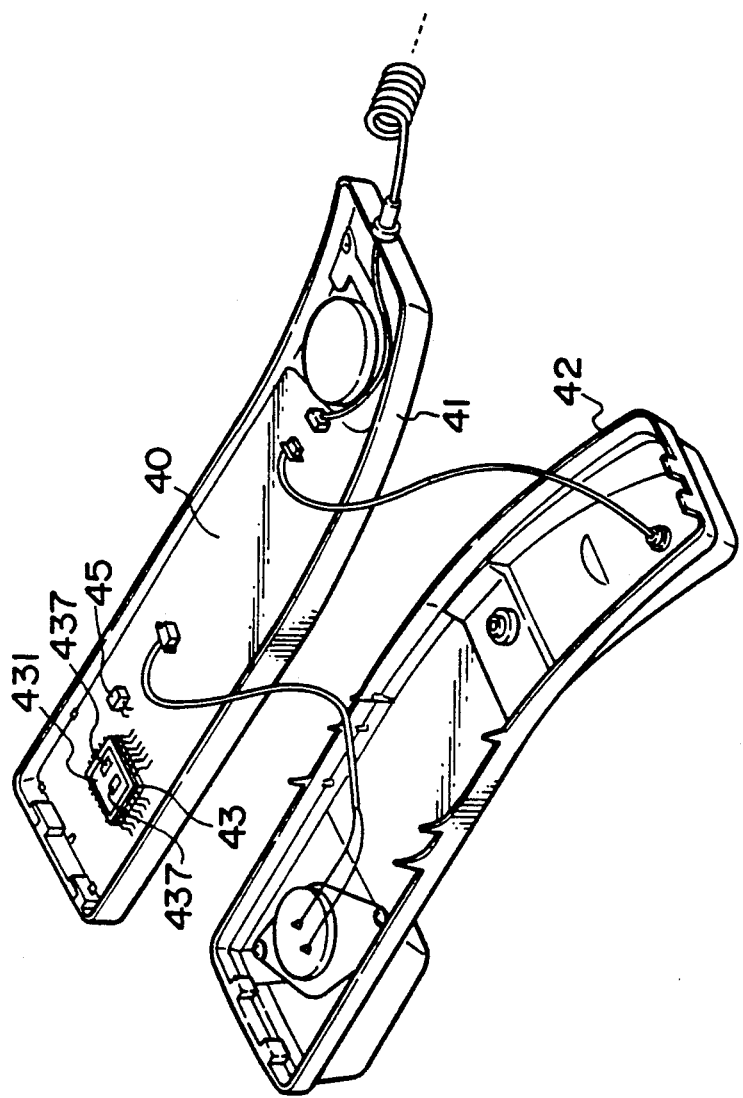
FIG. 10 is a perspective inside view of a handset of a portable type mobile radio apparatus also embodying the present invention.
Figure 11:
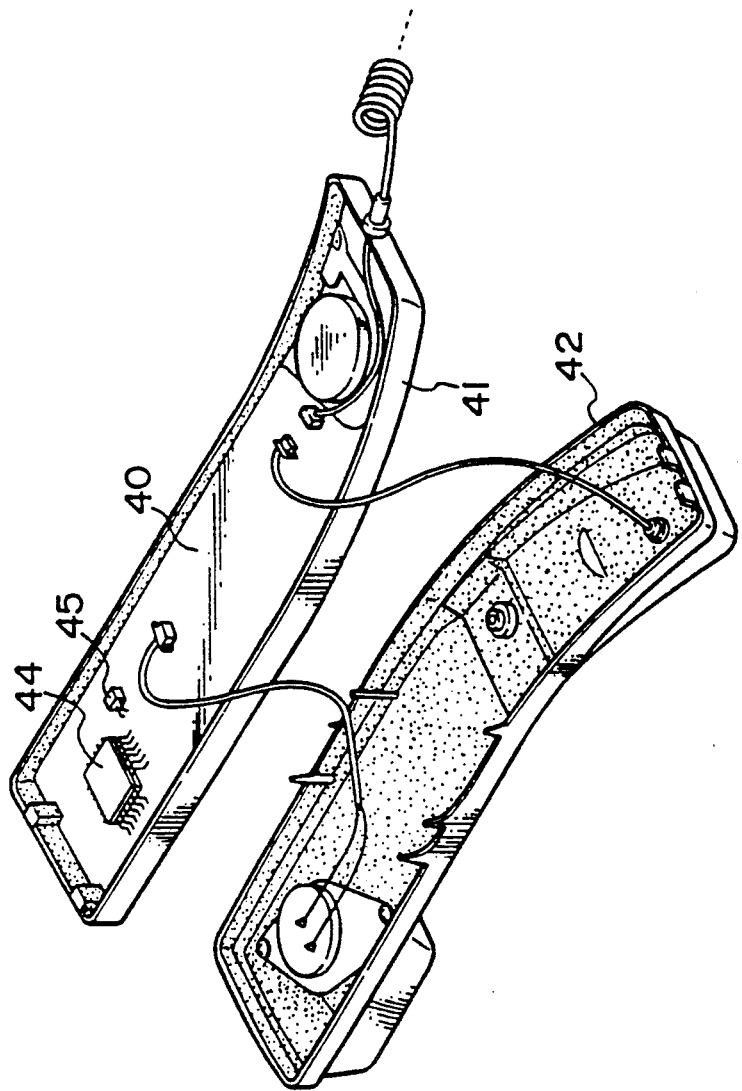
FIG. 11 is perspective inside view of a handset of the prior art.

FIG. 10 is a perspective inside view of a handset showing another shield construction of the present invention. On an IC 43 on circuit board 40, a conductive thin film 431 is applied and capacitors 437 are mounted. The conductive thin film 431 is constructed of a good conductor such as copper film or thin copper board.

Figure 5:
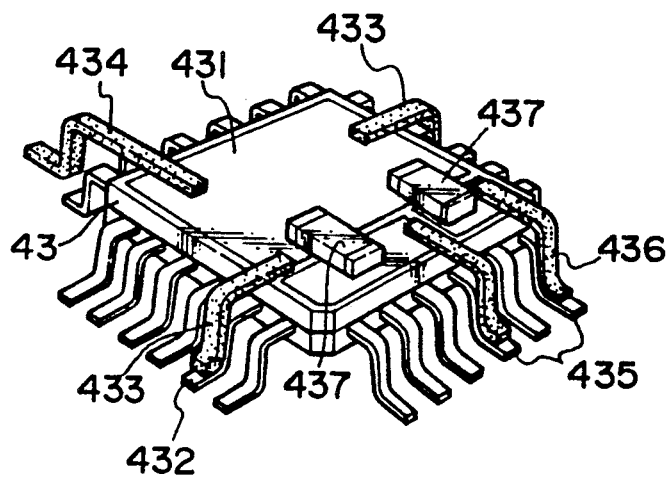
FIG. 5 is a perspective view of a fifth embodiment of a shield construction for an IC.
Figure 6:
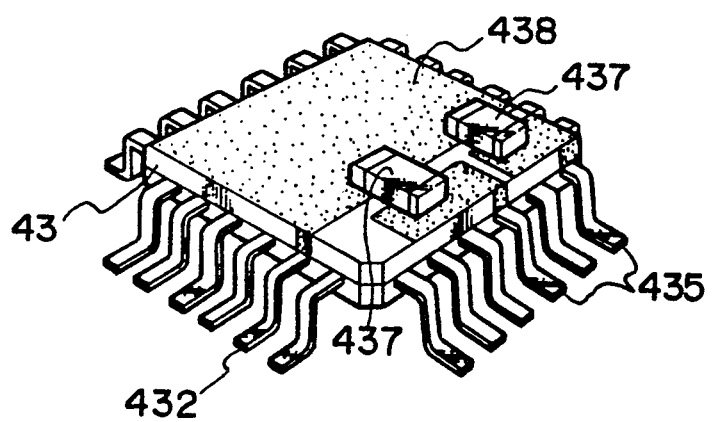
FIG. 6 is a perspective view of a sixth embodiment of a shield construction for an IC.
Figure 7:
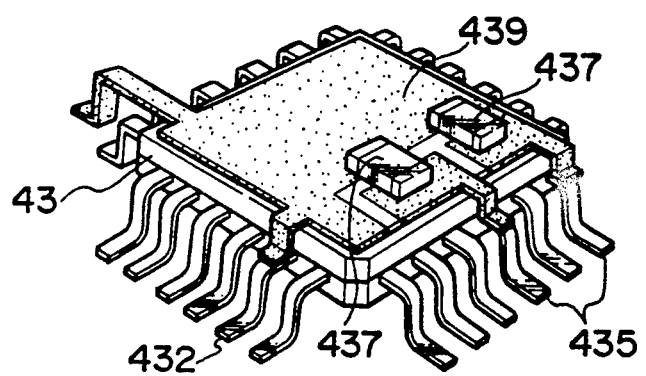
FIG. 7 is a perspective view of a seventh embodiment of a shield construction for an IC.
Figure 8:
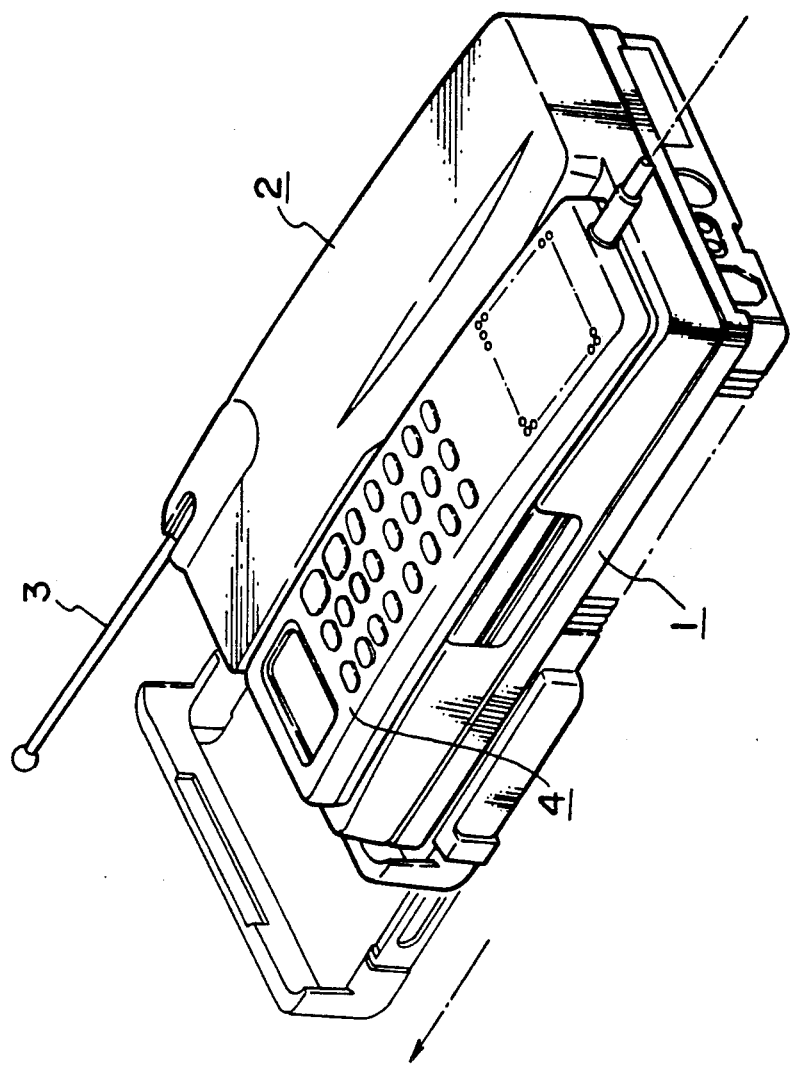
FIG. 8 is a perspective view of a portable type mobile radio apparatus embodying the present invention.

FIGS. 5 through 7 show other embodiments of the present invention consisting of two separate good conductors and capacitors on the IC package 43.

FIG. 5 shows a fifth embodiment of the present invention. In FIG. 5, 431 is a conductive thin film such as copper film adhered on the surface of the package by using suitable adhesives. 432 is a ground lead of IC 43. 433 is a good conductor such as an annealed copper wire which connects the conductive thin film 431 with the ground leads 432 using a connection method such as soldering. 434 is a good conductor which connects the conductive thin film 431 with the ground plane of the circuit board 40. Signal leads 435 are provided for input and output signals. Conductors 436 are good copper conductors such as annealed copper wires which connect conductive thin film 431 and signal leads 435.

Conductive thin film 431 is separated into two portions. One portion is ground conductor area and another portion is a capacitor electrode area. One side of capacitor 437 is connected to the ground conductor area and another side is connected to the capacitor electrode area. Good conductors 433, 434 are connection wires which connect the ground conductor area of the conductive thin film 431 with the ground plane of the circuit board 40. Good conductors 436 are connection wires which connect the capacitor electrode area of the conductive thin film 431 with the signal leads 435.

The operation of the present embodiment set forth hereinafter is almost the same explained in the above embodiments.

The interference waves coming into the IC 43 from antenna 3 are reflected or captured by the conductive thin film 431. The captured radio waves are introduced to the ground via good conductors 433, 434. As a result, interference radio waves reaching the inside of the IC 43 are decreased to a great extent. Therefore the malfunction of the IC 43 can be avoided. Also, the interference waves are not mixed with the frequency components of the digital signals in the non-linear area of such IC 43. Even if the mixture occurred in the IC 43, the generated undesired signal level would be very small.

Although the undesired waves are radiated from the IC 43, they are captured by the conductive thin film 431 and introduced to ground. Therefore the radiated waves do not reach the antenna 3. As a result the deterioration of the receiving sensitivity and the noise generation does not occur even at the weak electric field.

The conductive thin film 431 is adjacent the tips in the IC 43 via the insulated plastic of the IC 43. And the conductor size of the thin film 431 is larger than the tip size. The larger the conductive thin film 431 on the surface of the IC 43, the more the above effect increases.

The interference wave coming into the circuit pattern in the circuit board 40 is bypassed by the capacitor on the IC 43 before it reaches the IC 43. Especially for high frequency, waves it is preferable to mount the bypass capacitor 437 near the IC 43 so as to reject the component of the parasitic inductance and to enhance the effect of interference wave rejection. As described above, mounting the bypass capacitor on the IC 43 is very effective for rejecting interference.

Regarding to the ground connection of the leads in the above embodiments, the more the number of the leads increases, the more troublesome it becomes to connect the leads to the ground plane.

FIG. 6 shows sixth embodiment of the present invention which solves the above problem. In FIG. 6, thin metals 438 are plated on the package 43 instead of the copper thin film 431 of the embodiment of FIG. 5. The annealed copper wires 433, 436 in FIG. 5 are also plated by the thin metal on the package 43. In this construction, it is preferable to use heat resisting materials such as ceramics for the package. The ground leads 432 and signal leads 435 may be connected with metal plating 438 using a connection method such as soldering or coating.

FIG. 7 shows a seventh embodiment of the present invention. In FIG. 7, flexible sheets 439 are adhered on the package 43. The flexible sheets are constructed of conductive films on one of the flexible boards.

This embodiment of the invention using flexible conductive sheet 439 can be used to mount the flexible sheets after electrical elements are set up in the apparatus.

The embodiments described above may be applied to dual in-line packages as well as flat package IC's. In these embodiments the conductive thin film is formed on the packages 44 or 43, but it may be formed either on an under surface or both surfaces or side surfaces of the package.

And further, the shield construction may be used for other kinds of electrical devices required to reject undesired interference radio waves as well as in the electrical devices described in the above embodiments.

What is claimed is:

1. A shield construction for shielding an electrical device in a mobile communication apparatus from external electromagnetic interference and for absorbing re-radiation of undesired electromagnetic waves generated by non-linear characteristics of the elements of said electrical device where said electrical device is covered by insulated materials and has a plurality of leads extending therefrom for signal, ground and power supply connections, said shield construction comprising:

a conductive material mounted on and extending over at least the major surface of said electrical device, and connecting means connecting said conductive material to the ground potential of said ground leads at a plurality of locations around said conductive material, whereby interfering external electromagnetic waves reaching said electrical device and re-radiated undesired electromagnetic waves generated by non-linear characteristics of the elements of said electrical device are substantially absorbed and connected to ground potential.

2. The shield construction of claim 1, wherein said conductive material is a conductive film.

3. The shield construction of claim 1, wherein said conductive material is formed by metal plating on the surface of said electrical device.

4. The shield construction of claim 1, wherein said conductive material is formed on a flexible plastic film.

5. The shield construction of claim 1, wherein said conductive material is formed on the surface of the flexible conductive sheet.

6. A shield construction for shielding an electrical device from external electromagnetic interference where said electrical device is covered by insulated materials and has a plurality of leads extending therefrom for signal, ground and power supply connections, said shield construction comprising:

two portions of conducting materials mounted on and extending over at least one major surface of said electrical device, connecting means connecting at least one said portion to the potential of said ground leads and the other said portion to said signal lead, and at least one capacitor mounted on the conductive materials, the electrodes of which are each connected separately to one of said portions of said conductive materials respectively.

7. The shield construction of claim 6, wherein said conductive materials are conductive films.

8. The shield construction of claim 6, wherein said conductive materials are metal films which are plated on said electrical devices.

9. The shield construction of claim 6, wherein said conductive materials are formed on flexible sheets.

* * * * *

UNITED STATES PATENT AND TRADEMARK OFFICE
CERTIFICATE OF CORRECTION

PATENT NO. : 5,270,488
DATED : December 14, 1993
INVENTOR(S) : H. Ono et al

It is certified that error appears in the above-indentified patent and that said Letters Patent is hereby corrected as shown below:

Column 1, line 20, "views" should be --view--.
          line 45, "waves" should be --wave--.
Column 2, line 14, "non-" should be --non-linear--.
Column 3, line 15, after "44a" insert --by--.
Column 4, line 51, after "is" insert --a--.
Column 5, line 5, "the" should be --such--.
          line 22, "frequency, waves" should be --frequency waves,--.

Signed and Sealed this

Thirty-first Day of May, 1994

Attest:

BRUCE LEHMAN

*Attesting Officer*     *Commissioner of Patents and Trademarks*